Sept. 1, 1964 R. C. WITTENBERG 3,147,446

STABILIZED DRIFT COMPENSATED DIRECT CURRENT AMPLIFIER

Filed April 21, 1960

INVENTOR.
ROLAND C. WITTENBERG
BY
B. H. Spencer
AGENT

United States Patent Office 3,147,446
Patented Sept. 1, 1964

3,147,446

STABILIZED DRIFT COMPENSATED DIRECT CURRENT AMPLIFIER

Roland C. Wittenberg, New Hyde Park, N.Y., assignor, by mesne assignments, to Dynamics Corporation of America, New York, N.Y., a corporation of New York Filed Apr. 21, 1960, Ser. No. 23,841
7 Claims. (Cl. 330—9)

Figures 1, 2, 3, 5:
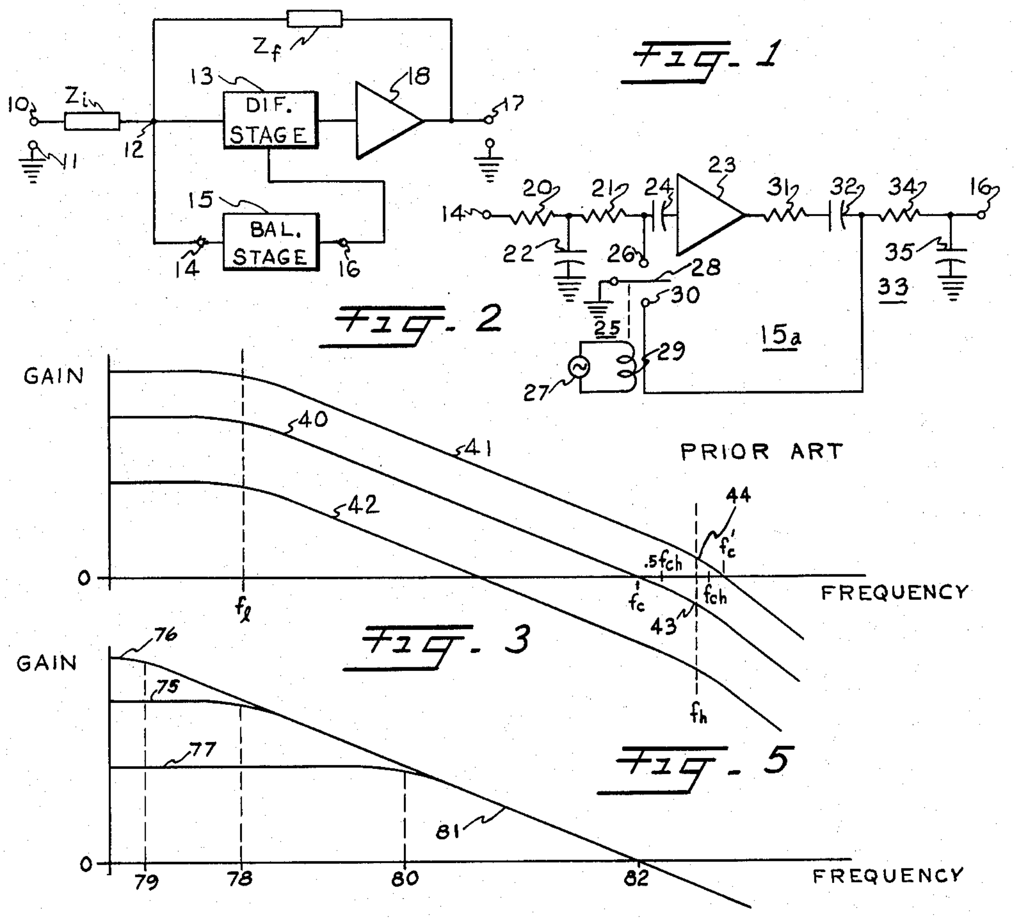

This invention relates to direct current amplifiers and in particular to direct current feedback amplifiers employing an auxiliary balancing amplifier stage for the purpose of reducing drift.

The reduction of drift has always been a serious problem in the design of high-grain D.-C. amplifiers. Changes in the characteristics of the active amplifier elements with time and temperature tend to produce slow variations in output voltage despite the use of stable resistors and regulated power supplies. Since drift is essentially a low-frequency phenomenon, its effect is to produce a slowly varying spurious output voltage. Therefore, some means of drift compensation is usually provided to assure that the output voltage will be zero when the input is zero, and that accurate amplification is obtained at these low frequencies.

One method of obtaining drift compensation is discussed by F. R. Bradley and R. D. McCoy in an article in the April 1952 issue of Electronics, published by the McGray-Hill Publishing Company. It is explained in this article that while the summing junction voltage due to the applied signal is held to an extremely low value by negative feedback, the voltage component at the junction due to drift may have a magnitude many times greater than that of the signal component. By amplifying the summing junction voltage in a drift-free balancing amplifier and combining it with the summing junction voltage itself, the drift voltage may be effectively attenuated. Another factor tending to reduce the accuracy of D.-C. amplifiers is the flow of current between the summing junction and the input stage of the amplifier. This difficulty may be overcome by inserting a high-pass filter between the summing junction and the input stage as disclosed in co-pending patent application Ser. No. 548,993, filed November 25, 1955, by Peter L. Richman, now Patent 3,065,428, and assigned to the same assignee as the present invention.

Drift-free balancing amplifier stages of the type discussed in the aforementioned article are usually provided with a modulator, which converts the summing junction voltage to an alternating voltage, and A.-C. amplifier, and a demodulator for transforming the amplified alternating voltage back to a direct voltage. A low-pass filter, coupled between the summing junction and the modulator isolates the input stage of the D.-C. amplifier from the modulator while a second filter is used to remove ripple from the output of the demodulator.

This prior art form of balancing amplifier while satisfactory for many applications, possesses certain disadvantages. For example, it has been found that an oscillatory condition is likely to arise unless the gain of the balancing amplifier falls below unity at a frequency less than one-half the modulator excitation frequency. In the balancing stage described, the crossover frequency (the frequency at which the gain equals unity) varies with the gain of the balancing amplifier and, therefore, variations in gain caused by changes in the characteristics of the amplifier components may be of sufficient magnitude to cause the crossover frequency to shift to a value greater than one-half the modulator excitation frequency. If the gain at this frequency exceeds unity by a sufficient margin, oscillations may result.

A second disadvantage found in prior art balancing amplifiers is caused by the effect of the low-frequency filters in both the input and output circuits of the stage. These filters produce a high-frequency corner on the gain-frequency characteristic curve of the balancing amplifier with a resultant slope at the high-frequency end of approximately 12 db per octave. A slope exceeding 12 db per octave tends to produce instability and, therefore, the amplifier is normally designed so that the high-frequency corner occurs at a frequency at which the gain is less than unity. An increase in amplifier gain may, however, bring the corner above the zero db level with the result that the amplifier may become unstable. In addition to these considerations, there is also a tendency under certain conditions for the large capacitor in the output filter to remain charged for a relatively long time thereby causing the D.-C. amplifier to saturate for a period which may extend over several seconds.

Accordingly, it is a principal object of this invention to provide an improved stabilized D.-C. amplifier which is not adversely affected by changes in the gain of the balancing amplifier stage.

Another object is to provide a stabilized D.-C. amplifier having a balancing amplifier stage in which the crossover frequency remains fixed and is not a function of the gain of this stage.

Still another object is to provide a stabilized D.-C. amplifier which will not tend to become unstable due to increases in the gain of the balancing amplifier stage.

Yet another object is to provide a stabilized D.-C. amplifier which will recover rapidly after having been driven into a saturated condition.

A further object is to provide a stabilized D.-C. amplifier having components requiring a minimum amount of space.

The foregoing objects are achieved in the present invention in which a capacitor is connected between the output of the balancing amplifier stage and the input of the modulator, the input filter network omitted, and the output filter reduced in size. By this arrangement, the crossover frequency is held constant regardless of changes in the gain of the A.-C. amplifier, and the high-frequency corner made to occur at a frequency outside the operating range of the stage. This permits the amplifier to be designed for maximum gain-bandwidth product without the necessity of compensating for possible variations in A.-C. amplifier gain.

Figure 4:
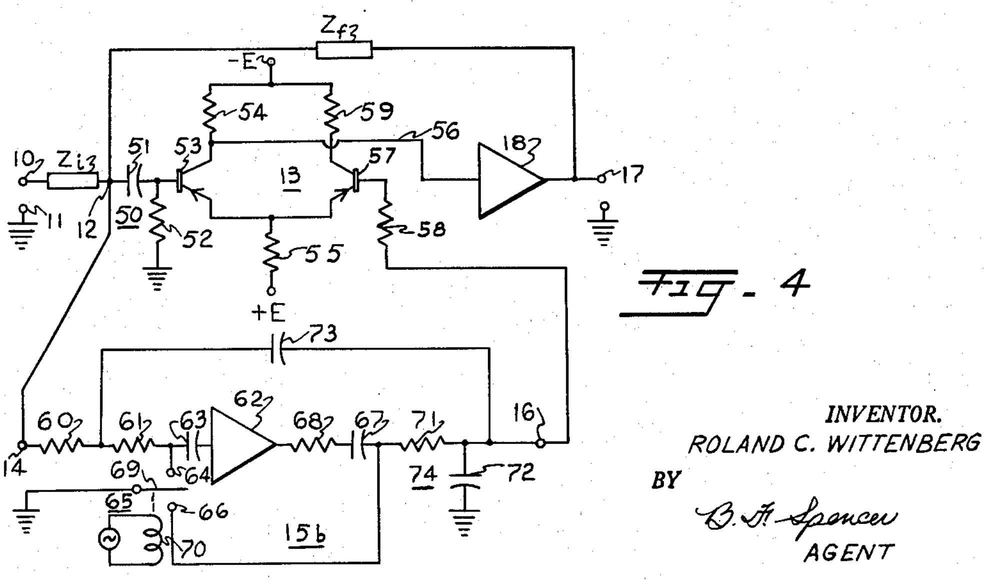

The above objects of and the brief introduction to the present invention will be more fully understood from a study of the following detailed description in connection with the drawings wherein:

FIG. 1 is a block diagram of a D.-C. amplifier incorporating a balancing amplifier stage, FIG. 2 is a schematic diagram of a typical balancing amplifier stage used in balancing prior art D.-C. amplifiers, FIG. 3 is a plot of gain versus frequency for the prior art balancing amplifier stage of FIG. 2, FIG. 4 is a schematic diagram of a D.-C. amplifier employing the balancing amplifier stage of the present invention, and FIG. 5 is a plot of gain versus frequency for the balancing amplifier stage of the present invention.

Referring to FIG. 1, there is shown a block diagram of a conventional D.-C. amplifier incorporating a balancing stage. An input signal applied across terminals 10 and 11 is coupled through an input impedance $Z_1$ to a summing junction 12. The voltage at summing junction 12 is impressed on one input of a differential or combining stage 13 and, in addition, is fed to the input terminal 14 of a narrow band drift-free balancing amplifier stage 15. The output terminal 16 of stage 15 is coupled to a second input of differential amplifier 13 where it is combined with the summing junction voltage. The output of differential stage 13 is connected to amplifier output terminal 17 through a direct current amplifier stage 18. A feedback impedance $Z_f$, coupled between the output of stage 18 and summing junction 12, provides negative feedback for the entire D.-C. amplifier.

The voltage at summing junction 12, resulting from the application of an input signal to terminals 10 and 11, is maintained at an extremely small value by the negative feedback provided through impedance $Z_f$. However, drift occurring in the differential stage 13 may produce a relatively large voltage at the summing junction. By amplifying the summing junction voltage in the drift-free balancing stage 15 and feeding it back to the differential stage 13 with the proper phase, the drift voltage appearing at output terminal 17 is substantially reduced.

In FIG. 2, there is shown a balancing stage **15*a* of the type used to stabilize prior art D.-C. amplifiers. In this stage, the input terminal 14 is coupled through a law-pass filter comprising resistors 20, 21 and capacitor 22 to a drift-free A.-C. amplifier 23 having an input capacitor 24. A relay chopper 25, having a stationary contact 26 connected to the junction of resistor 21 and capacitor 24, grounds this junction during alternate half cycles of the alternating voltage from source 27 by means of a grounded vibrating arm 28. Arm 28 is actuated by a coil 29 excited from alternating voltage source 27. The output of A.-C. amplifier 23 is coupled to a second stationary contact 30 of chopper 25 through a resistor 31 and a capacitor 32. Chopper 25 grounds the output of A.-C. amplifier 23 during the half cycle that the input to the amplifier is not grounded thereby demodulating the A.-C. amplifier output signal and producing a direct voltage having a ripple component. The ripple component is attenuated by a filter 33 comprising a resistor 34 and a capacitor 35**.

FIG. 3 is a plot of the gain in decibels as a function of the logarithm of frequency for the balancing amplifier stage shown in FIG. 2. Each of the three curves 40, 41 and 42 illustrates the gain-frequency characteristic of the stage for a different value of gain of A.-C. amplifier 23. Curve 40 represents the variations in gain of the stage with frequency under normal operating conditions, curve 41 shows the gain-frequency characteristic when the gain of amplifier 23 has increased above its designed value and curve 42 when the amplifier gain has decreased below this value. Variations in the gain of amplifier 23 may be caused by changes in the characteristics of the tubes, transistors, or other components with time and temperature or by fluctuations in the power supply voltages.

The shape and position of curve 40 representing normal operating conditions is determined by several factors which must be considered in the design of the balancing amplifier stage. First, at low frequencies the gain of the stage should be relatively high since drift originating in each of the following stages is reduced in proportion to the amount of drift-less gain preceding it. Another consideration is that the crossover frequency $f_c$ must be less than one-half the chopper frequency to avoid the synchronous oscillations often caused in chopper-stabilized D.-C. amplifiers when the gain at one-half the chopper frequency exceeds unity. A third factor is that the slope of the gain-frequency characteristic should not exceed 12 db per octave for any extended band of frequencies less than the crossover frequency $f_c$.

As illustrated by curve 40 the gain of the balancing amplifier stage is constant at low frequencies. As the signal frequency is raised, filter 33 becomes effective causing the gain to decrease at a ratio of about 6 db per octave. The low-frequency corner $f_l$ at which this change in slope occurs is determined by the values of resistor 34 and capacitor 35. The gain of the stage continues to decrease with increasing frequency at approximately 6 db per octave becoming equal to unity at the crossover frequency $f_c$. As previously discussed, the amplifier is designed to have a normal crossover frequency equal to less than one-half the chopper frequency $f_{ch}$ in order to avoid the possibility of synchronous oscillations arising from operation of the chopper. At the high-frequency corner $f_h$, which is determined by the value of the components comprising low-pass filters 20–22 and 33, a second change in slope occurs. The slope of the curve for frequencies higher than $f_h$ is about 12 db. per octave. Stability is maintained, however, since the gain of the stage is less than unity.

If the gain of A.C. amplifier 23 increases so that the gain-frequency characteristic follows curve 41, the crossover frequency will shift proportionally to a higher value $f_c'$. In the example illustrated, the increase in gain is sufficient to cause the new crossover frequency $f_c'$ to exceed one-half $f_{ch}$. Since the gain at one-half the chopper frequency is now larger than zero db, there will be a tendency for the system to oscillate at this frequency.

As second effect resulting from the increase in amplifier gain is the increase in the gain of the stage at the high-frequency corner $f_h$ from its value at 43 to the larger value at 44. Since the slope of curve 41 is about 12 db per octave in the portion of the frequency range where the gain of the stage exceeds unity, the margin of stability will be reduced.

Curve 42 illustrates the gain-frequency characteristic resulting from a decrease in the gain of A.-C. amplifier 23. As can be seen, decreased gain will not normally result in synchronous oscillations being generated or in instability since the attenuation in the high-frequency region has been increased. However, it has been found that certain sub-multiples of the chopper frequency, in addition to one-half, may also cause instability and it is desirable, therefore, to stabilize the crossover frequency at a selected optimum value.

FIG. 4 is a schematic diagram of a stabilized D.-C. amplifier utilizing the present invention. In this novel D.-C. amplifier the crossover frequency of the balancing stage is independent of the gain of the A.-C. amplifier 62. As explained in connection with the block diagram of FIG. 1, a signal applied between input terminals 10 and 11 is coupled through input impedance $Z_i$ to the summing junction 12. The higher frequency components in the input signal are transmitted through a high-pass filter 50 consisting of a capacitor 51 and a resistor 52 to the base of a transistor 53. The collector of transistor 53 is coupled by resistor 54 to a source of negative voltage $-E$ while the emitter is connected by resistor 55 to a source of positive voltage $+E$. The collector of transistor 53 is connected by a lead 56 to the input of direct-coupled amplifier 18, the output of amplifier 18 being coupled to summing junction 12 by feedback impedance $Z_f$.

The voltage at summing junction 12 is also amplified in the narrow-band drift-free balancing stage **15*b* and is then coupled to the base of transistor 57 through resistor 58. The emitter of transistor 57 is connected to the emitter of transistor 53 while its collector is coupled to the negative voltage source $-E$ through a resistor 59. Transistors 53 and 57 comprise a differential stage in which changes in the base to emitter voltage of transistor 57 oppose variations in the base to emitter voltage of transistor 53. Thus, drift voltage components appearing at the base of transistor 53 are opposed by the amplified drift voltage coupled to the base of transistor 57 thereby reducing the effect of drift on the output voltage at terminal 17**.

The balancing stage **15*b* includes a pair of isolating resistors 60 and 61 which are coupled to the input of A.-C. amplifier 62 through capacitor 63. One terminal 64 of a relay chopper 65 is connected to the junction of resistor 61 and capacitor 63 while the other terminal 66 is connected to the output of amplifier 62 through a capacitor 67 and resistor 68. A grounded arm 69 of chopper 65 is actuated by a coil 70 to alternately ground the input and output circuits of A.-C. amplifier 62** thereby converting the summing junction voltage to an alternating voltage and the output of amplifier 62 to a pulsating direct voltage.

The higher frequency components in the input signal are coupled through high-pass filter 50 and transistor 53 directly to amplifier 18. The low-frequency input signal components on the other hand, are blocked by capacitor 51 and are amplified by the drift-free balancing stage before being coupled to amplifier 18. Due to the mechanical limitations of chopper 65, the frequency of the alternating voltage used to excite coil 70 is generally limited to a relatively low value, frequencies of 60 or 400 cycles per second being commonly employed. Since the frequencies amplified by the balancing stage are of the order of fractions of a cycle per second, the narrow bandwidth of the balancing stage does not adversely affect the overall bandwidth of the amplifier. The pulsating direct voltage produced at the junction of terminal 66 and capacitor 67 is coupled through a smoothing circuit 74 comprising a resistor 71 and a capacitor 72, the output of the filter being applied to output terminal 16.

A feedback capacitor 73 is connected between the output terminal 16 and the junction of resistors 60 and 61. By connecting the capacitor 73 between the output and the input of the balancing stage 15*b*, the gain-frequency characteristic is made independent of changes in the gain of A.-C. amplifier 62 at the crossover frequency, and a substantial improvement over the prior art is achieved.

FIG. 5 is a graph depicting the gain-frequency characteristic of balancing stage 15*b*. At the low-frequency end of the curve, the gain of the stage is a function of the gain of A.-C. amplifier 62. Segment 75 of the curve represents the gain at low frequencies when the gain of amplifier 62 is at its normal level, segment 76 when the gain of amplifier 62 is higher than normal, and segment 77 when the gain is less than normal. The low-frequency corners 78, 79, and 80 of each of these curves occur at frequencies which are functions of both the gain of amplifier 62 and the values of resistor 60 and feedback capacitor 73. When the frequency is increased to the region denoted by the numeral 81, the change in gain of balancing stage 15*b* with frequency becomes dependent solely on the product of the values of resistor 60 and feedback capacitor 73 and is independent of the gain of amplifier 62. In this region, the gain decreases at a rate of about 6 db per octave, the crossover frequency 82 being equal in radians to the reciprocal of the time constant obtained from the product of the values of resistor 60 and feedback capacitor 73. Thus, the crossover frequency 82 can be fixed at a value which will not produce amplifier instability and which will not shift with changes in the gain of A.-C. amplifier 62.

The connection of capacitor 73 between the output terminal 16 and the junction of resistors 60 and 61, as shown in FIG. 4, provides an effective capacity at the output of the balancing stage approximately equal to the gain of amplifier 62 multiplied by the value of capacitor 73. Therefore, capacitor 73 can be considerably smaller in size than filter capacitor 35, found in the prior art balancing stage of FIG. 2, and still provide the same degree of filtering. Capacitor 73, in conjunction with resistors 60 and 61, also acts to isolate relay chopper 65 from the summing junction of differential stage 13.

Summerizing, one significant feature of this invention is the provision of a stabilized D.-C. amplifier having a drift-free balancing stage with a crossover frequency that is independent of changes in the gain of the balancing amplifier. This assures that oscillations at a sub-multiple of the modulator reference frequency will not occur if the gain of the balancing amplifier changes with time or temperature. Another important feature is that the balancing stage will not become unstable due to an increase in the gain of the stage nor will the amplifier be disabled for long periods of time due to an accumulation of charge on the filter capacitor during saturation of the balancing stage. In addition, the use of a relatively small feedback capacitor to provide filtering at the output of the balancing stage is important because it significantly reduces the space which must be allotted for installation of the D.-C. amplifier.

As many changes could be made in the above construction and many different embodiments could be made without departing from the scope thereof, it is intended that all matter contained in the above description or shown in the accompanying drawing shall be interpreted as illustrative and not in a limiting sense.

What is claimed is:

1. In a stabilized direct current amplifier system having first and second inputs and an output circuit, a balancing circuit comprising in combination first and second series-connected resistors, one end of said series-connected resistors being coupled to one of the inputs of said stabilized direct current amplifier system, an alternating current amplifier having an input coupled to the other end of said series-connected resistors, filter means coupled to the output of said alternating current amplifier, relay chopper means having first and second stationary contacts connected respectively to the input and output of said alternating current amplifier, said relay chopper means further having a movable contact connected to a common reference point, feedback capacitor means coupled between the output of said filter means and the junction between said first and second series-connected resistors, and means coupling the output of said filter means to the other input of said stabilized direct current amplifier system.

2. A stabilized direct current amplifier system comprising in combination, an input stage having first and second inputs and an output circuit, a direct current amplifier having an input coupled to the output circuit of said input stage, an input impedance element having one end terminal coupled to the first input of said input stage, the other end terminal of said input impedance element being adapted for receiving an applied input signal, a feedback impedance element coupled between the output of said direct current amplifier and the first input of said input stage, a drift-free balancing amplifier circuit having an input coupled to the first input of said input stage and an output coupled to the second input of said input stage, said drift-free balancing amplifier circuit including first and second series-coupled input resistors, a modulator, an alternating current amplifier, a demodulator, and a filter means coupled in cascade, the input terminal of said first and second series-coupled input resistors being coupled to the first input of said input stage and the output of said filter means being coupled to the second input of said input stage, and feedback capacitor means coupled between the output of said filter means and the junction between said first and second series-coupled input resistors.

3. A stabilized direct current amplifier system comprising in combination, an input amplifier stage having first and second input terminals and an output circuit, said first input terminal being adapted for receiving an applied input signal, a direct current amplifier having an input coupled to the output circuit of said input amplifier stage, modulator means, input resistor means having one terminal coupled to said modulator means, the other terminal of said input resistor means being adapted for receiving said applied input signal, an alternating current amplifier having an input coupled to said modulator, demodulator means coupled to the output of said alternating current amplifier, low-pass filter means coupled to the output of said demodulator, a feedback capacitor coupled between the output of said low-pass filter means and said one terminal of said input resistor coupled to said modulator, and means coupling the output of said low-pass filter means to the second input terminal of said input amplifier stage.

4. A balancing amplifier stage for stabilizing a direct current feedback amplifier having first and second input terminals and an output terminal, comprising in combination, modulator means, resistor means coupling said modulator means to the first input terminal of said direct current feedback amplifier, an alternating current amplifier having an input coupled to said modulator means, demodulator means coupled to the output of said alternating current amplifier, said demodulator means converting the amplified voltage from said alternating current amplifier into a direct voltage, feedback capacitor means coupled between the output of said demodulator means and the junction between said resistor means and said modulator means, and means coupling the output of said demodulator means to the second input terminal of said direct current feedback amplifier.

5. A balancing amplifier stage for stabilizing a direct current amplifier, comprising in combination, an input terminal, first and second series-connected resistors, one end of said series-connected resistors being coupled to said input terminal, modulator means coupled to the other end of said series-connected resistors, an alternating current amplifier having an input coupled to said modulator means, demodulator means coupled to the output of said alternating current amplifier, said demodulator means converting the amplified voltage from said alternating current amplifier into a direct voltage, feedback capacitor means coupled between the output of said demodulator means and the junction between said first and second series-coupled resistors, an output terminal, and means coupling the output of said demodulator means to said output terminal .

6. A balancing amplifier stage for stabilizing a direct current amplifier, comprising in combination, an input terminal, first and second series-connected resistors, one end of said series-connected resistors being coupled to said input terminal, an alternating current amplifier having an input and an output terminal, a first capacitor coupled between the other end of said series-connected resistors and the input of said alternating current amplifier, a low-pass filter means having an input and an output, a second capacitor coupled between the output terminal of said alternating current amplifier and the input of said low-pass filter means, relay chopper means having first and second stationary contacts and a movable contact, said first stationary contact being coupled to the junction between the other end of said series-connected resistors and said first capacitor, said second stationary contact being coupled to the junction between said second capacitor and the input of said low-pass filter, said movable contact being coupled to a common reference point, feedback capacitor means coupled between the output of said low-pass filter means and the junction between said first and second series-connected resistors, an output terminal, and means coupling the output of said low-pass filter means to said output terminal.

7. In a direct current amplifier system having an input stage with first and second input terminals and an output terminal, said first terminal being adapted to receive an input signal, said direct current amplifier system further having a direct current amplifier coupled to the output terminal of said input stage, the combination comprising a modulator, an input resistor coupling said input signal to said modulator, said modulator converting said input signal into an alternating voltage, an alternating current amplifier having an input coupled to said modulator, a demodulator coupled to the output of said alternating current amplifier, said demodulator converting the amplified alternating voltage from said alternating current amplifier into a direct voltage, filter means coupled to the output of said demodulator for smoothing said direct voltage, a feedback capacitor coupled between the output of said filter means and the junction between said input resistor and said modulator, and means coupling the direct voltage from said filter means to the second input terminal of said input stage.

References Cited in the file of this patent

UNITED STATES PATENTS

| | | |
|---|---|---|
| 2,668,238 | Frink | Feb. 2, 1954 |
| 2,730,573 | Sedgfield et al. | Jan. 10, 1956 |
| 2,801,296 | Blecher | July 30, 1957 |
| 2,896,027 | Smith | July 21, 1959 |
| 2,916,702 | Bigelow | Dec. 8, 1959 |
| 2,919,409 | Williams | Dec. 29, 1959 |
| 2,968,005 | Patmore | Jan. 10, 1961 |
| 3,007,116 | Gerhard | Oct. 31, 1961 |
| 3,058,068 | Hinrichs et al. | Oct. 9, 1962 |
| 3,065,428 | Richman | Nov. 20, 1962 |

FOREIGN PATENTS

| | | |
|---|---|---|
| 620,140 | Great Britain | Mar. 21, 1949 |

OTHER REFERENCES

Hochwald et al.: The Proceedings of the National Electronics Conference, vol. 14, pages 798–810, October 1958.